United States Patent
Reiter et al.

(10) Patent No.: US 11,778,735 B2
(45) Date of Patent: Oct. 3, 2023

(54) CIRCUIT BOARD HAVING A COOLING AREA ABOVE AND BELOW A SEMICONDUCTOR CHIP

(71) Applicant: Infineon Technologies AG, Neubiberg (DE)

(72) Inventors: Tomas Manuel Reiter, Munich (DE); Mark Nils Muenzer, Neubiberg (DE); Andre Uhlemann, Wickede (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/683,979

(22) Filed: Mar. 1, 2022

(65) Prior Publication Data
US 2022/0183147 A1 Jun. 9, 2022

Related U.S. Application Data

(63) Continuation of application No. 16/711,648, filed on Dec. 12, 2019, now Pat. No. 11,266,012.

(30) Foreign Application Priority Data

Dec. 13, 2018 (DE) .......................... 102018132143.0

(51) Int. Cl.
*H05K 1/02* (2006.01)
*H05K 1/18* (2006.01)
(Continued)

(52) U.S. Cl.
CPC .......... *H05K 1/0272* (2013.01); *H01L 23/44* (2013.01); *H01L 23/473* (2013.01);
(Continued)

(58) Field of Classification Search
CPC ..... H05K 1/0272; H05K 1/0201–0212; H05K 1/181–188; H05K 7/20271;
(Continued)

(56) References Cited

U.S. PATENT DOCUMENTS 6,052,284 A * 4/2000 Suga ..................... H01L 23/473
   361/689
7,477,513 B1 * 1/2009 Cader ................ H05K 7/20345
   257/714
(Continued)

FOREIGN PATENT DOCUMENTS

DE          3831610 A1    3/1990
DE    102013203932 A1    9/2014
(Continued)

OTHER PUBLICATIONS

Wits, Wessel W., et al., "TRIZ based interface conflict resolving strategies for modular product architectures", TRIZ Future Conference 2010, Procedia Engineering 9, 2011, pp. 30-39.

*Primary Examiner* — Amir A Jalali
(74) *Attorney, Agent, or Firm* — Murphy, Bilak & Homiller, PLLC (57) ABSTRACT

A circuit board includes: an electrically insulating part and an electrically conductive part; at least one semiconductor chip embedded into the electrically insulating part in a part of the circuit board; and a cooling area above and below the at least one semiconductor chip. The electrically conductive part includes a first outer conductive layer on the first surface, a second outer conductive layer on the second surface, and a first inner conductive layer which is electrically connected to the semiconductor chip. The first inner conductive layer is electrically insulated from the first outer conductive layer and from the second outer conductive layer by the electrically insulating part in the cooling area, or is electrically connected to the first outer conductive layer outside the cooling area.

20 Claims, 3 Drawing Sheets

(51) Int. Cl.
*H01L 23/473* (2006.01)
*H01L 23/44* (2006.01)
*H05K 7/20* (2006.01)

(52) U.S. Cl.
CPC .......... *H05K 1/0203* (2013.01); *H05K 1/185* (2013.01); *H05K 7/20272* (2013.01); *H05K 7/20927* (2013.01); *H05K 2201/064* (2013.01); *H05K 2201/09063* (2013.01); *H05K 2201/10166* (2013.01)

(58) Field of Classification Search
CPC .......... H05K 7/20772; H05K 7/20872; H05K 7/20927; H05K 2201/064; H05K 2201/10166; H01L 23/46; H01L 23/50; H01L 23/473; H01L 23/34; H01L 23/36–3675
See application file for complete search history.

(56) References Cited

U.S. PATENT DOCUMENTS

| | | | |
|---|---|---|---|
| 9,148,946 B1 | 9/2015 | Singh et al. | |
| 10,542,640 B1 * | 1/2020 | Leigh | H05K 7/20772 |
| 10,943,851 B1 | 3/2021 | Elsherbini et al. | |
| 10,945,333 B1 | 3/2021 | Joshi et al. | |
| 2006/0038284 A1 | 2/2006 | Brandenburg et al. | |
| 2009/0108435 A1 * | 4/2009 | Bernstein | H01L 23/473 |
| | | | 257/E23.079 |
| 2009/0296349 A1 | 12/2009 | Suzuki | |
| 2012/0080222 A1 * | 4/2012 | Kim | H01L 24/17 |
| | | | 174/260 |
| 2012/0187575 A1 * | 7/2012 | Sasaki | H01L 22/22 |
| | | | 438/109 |
| 2012/0300402 A1 * | 11/2012 | Vos | H01L 23/473 |
| | | | 165/104.33 |
| 2013/0001798 A1 * | 1/2013 | Choi | H01L 24/17 |
| | | | 257/774 |
| 2015/0108604 A1 * | 4/2015 | Nakamura | H01L 24/02 |
| | | | 257/532 |
| 2017/0347458 A1 * | 11/2017 | Lai | H05K 1/185 |
| 2018/0082925 A1 * | 3/2018 | Grassmann | H01L 23/473 |
| 2020/0126924 A1 * | 4/2020 | Lee | H01L 24/20 |

FOREIGN PATENT DOCUMENTS

| | | |
|---|---|---|
| DE | 112015004284 T5 | 6/2017 |
| DE | 202017006874 U1 | 10/2018 |
| EP | 2985788 A1 | 2/2016 |
| WO | 2018001983 A1 | 1/2018 |

* cited by examiner

CIRCUIT BOARD HAVING A COOLING AREA ABOVE AND BELOW A SEMICONDUCTOR CHIP

TECHNICAL FIELD

The application relates to a circuit board comprising at least one embedded semiconductor chip, to a chip cooling housing, to an assembly, and to a method for cooling a semiconductor chip.

BACKGROUND

Electronic devices typically comprise one or more circuit boards, e.g. printed circuit boards (PCBs). The circuit boards each carry one or a plurality of semiconductor chips, wherein the semiconductor chips can be arranged on the circuit boards or else can be embedded into the circuit boards. In the case of embedding, the semiconductor chips are surrounded by circuit board material for example from all sides. Power semiconductor chips generate heat that has to be dissipated from the semiconductor chips in order that the latter are not damaged by overheating and in order to be able to guarantee the specified lifetime. In the case where semiconductor chips are embedded into circuit boards, heat dissipation can be hampered by unfavorable heat conducting properties of the insulating material of the circuit boards.

An improvement in the cooling of semiconductor chips embedded into a circuit board is desirable.

SUMMARY

The present disclosure relates to a circuit board. The circuit board comprises an electrically insulating part and an electrically conductive part. The circuit board comprises at least one semiconductor chip embedded into the electrically insulating part in a part of the circuit board. The circuit board comprises through openings in the part of the circuit board for passage of a cooling liquid. The through openings extend from a first surface of the circuit board to a second surface of the circuit board. The electrically conductive part comprises a first outer conductive layer on the first surface and a second outer conductive layer on the second surface. The electrically conductive part additionally comprises a first inner conductive layer, wherein the first inner conductive layer is electrically connected to the semiconductor chip. The first inner conductive layer is electrically insulated from the first outer conductive layer and from the second outer conductive layer by the electrically insulating part in the part of the circuit board.

The present disclosure additionally relates to a chip cooling housing. The chip cooling housing comprises a coolant inlet and a coolant outlet. The chip cooling housing is configured to be secured to a circuit board in such a way that a first part of the circuit board is tightly enclosed by the chip cooling housing and a cooling space is formed between the first part of the circuit board and the chip cooling housing, and a second part of the circuit board projects from the chip cooling housing.

The present disclosure additionally relates to an assembly. The assembly comprises the circuit board and the chip cooling housing. The chip cooling housing is secured to the circuit board.

The present disclosure additionally relates to a method for cooling a semiconductor chip embedded into a circuit board. The method comprises securing the chip cooling housing to a circuit board comprising the semiconductor chip. The method additionally comprises introducing a coolant into the cooling space.

Further features and advantages of the subject matter disclosed will become apparent to the person skilled in the art from the following detailed description and from the drawings.

BRIEF DESCRIPTION OF THE DRAWINGS

The accompanying drawings convey a deeper understanding of exemplary embodiments for a circuit board, a chip cooling housing or an assembly, are included in the disclosure and form a part thereof. The drawings merely illustrate exemplary embodiments and serve together Consequently, circuit boards, chip cooling housings and assemblies described herein are not restricted to the exemplary embodiments by the description thereof. Further exemplary embodiments and intended advantages are evident from the understanding of the following detailed description and from combinations of the exemplary embodiments described below, even if they are not explicitly described. The elements and structures shown in the drawings are not necessarily illustrated in a manner true to scale with respect to one another. Identical reference signs refer to identical or mutually corresponding elements and structures.

DETAILED DESCRIPTION

In the following detailed description, reference is made to the accompanying drawings, which form part of the disclosure and show specific exemplary embodiments of a circuit board, of a chip cooling housing and of an assembly for illustration purposes. It goes without saying that further exemplary embodiments exist. It likewise goes without saying that structural and/or logical changes can be made to the exemplary embodiments, without in so doing departing from what is defined by the patent claims. The description of the exemplary embodiments is non-limiting in this respect. In particular, features of exemplary embodiments described below can be combined with features of others of the exemplary embodiments described, provided that nothing to the contrary is evident from the context.

The terms "have", "contain", "encompass", "comprise" and the like hereinafter are open terms which on the one hand indicate the presence of the stated elements or features, and on the other hand do not exclude the presence of further elements or features. The indefinite articles and the definite articles encompass both the plural and the singular, unless something to the contrary is clearly evident from the context.

The term or expression "electrically connected" describes a resistive, e.g. a low-resistance, connection between the electrically connected elements, for example a direct contact between the relevant elements or a connection by way of a metal and/or a highly doped semiconductor.

If a value range with the indication of one limit value or two limit values is defined for a physical variable, then the expressions "from" and "to" or "less" and "more" include the respective limit value. An indication of the type "from . . . to" is accordingly understood as "from at least . . . to at most". Correspondingly, an indication of the type "less . . . " ("more . . . ") is understood as "at most . . . " ("at least . . . ").

The abbreviation IGFET (insulated gate field effect transistor) denotes voltage-controlled semiconductor switches and encompasses not only MOSFETs (metal oxide semiconductor FETs) but also such FETs whose gate electrode comprises doped semiconductor material and/or whose gate dielectric does not comprise oxide or does not exclusively consist of an oxide.

A safe operating area (SOA) defines ambient and operating conditions for which fail-safe operation of a semiconductor component can be expected. The safe operating area is typically defined by the specification of maximum values for ambient and operating conditions in a data sheet for the semiconductor component, the so-called component specification, e.g. maximum continuous load current, maximum pulsed load current, maximum gate voltage, maximum reverse voltage, and so on.

One exemplary embodiment relates to a circuit board. The circuit board can comprise for example an electrically insulating part and an electrically conductive part. The circuit board can for instance be formed as a PCB and comprise a plurality of conductive layers separated from one another by insulating layers. The conductive layers define the conductive part and are formed for example from one conductive material or else from a plurality of conductive materials. One exemplary conductive material is a metal such as e.g. copper, which can be formed in the form of conductive tracks and/or conductive terminal regions. By way of example, a fiber reinforced plastic or else some other insulating material is used as the insulating part. It is possible to combine one or else a plurality of insulating materials that define the insulating part of the circuit board. Conductor tracks of different conductive layers, e.g. layers arranged one above another, can be electrically connected to one another for example by way of vias. The vias extend through the insulating material between the conductive layers to be electrically connected and electrically connect for instance conductor tracks of conductor tracks arranged one above another to one another.

At least one semiconductor chip can be embedded into the electrically insulating part in a part of the circuit board. The part of the circuit board is suitable for example for being introduced into a cooling housing. By way of example, the at least one semiconductor chip can be positioned between two layers of the conductive part that are arranged one above the other, and can be electrically connected to conductor tracks or terminal regions of the respective conductive layers by way of vias.

The circuit board can additionally comprise through openings in the part of the circuit board for passage of a cooling liquid. The through openings can be produced by a customary method such as, for instance, drilling, laser processing or etching. The through openings can extend from a first surface of the circuit board to a second surface of the circuit board.

The electrically conductive part can comprise a first outer conductive layer on the first surface and a second outer conductive layer on the second surface. The electrically conductive part can additionally comprise a first inner conductive layer, wherein the first inner conductive layer can be electrically connected to the semiconductor chip. The first inner conductive layer can be electrically insulated from the first outer conductive layer and from the second outer conductive layer by the electrically insulating part in the part of the circuit board. Consequently, the outer conductive layers can protect the embedded semiconductor chip in the part of the circuit board against cooling liquid penetrating into the interior of the circuit board. The outer conductive layers in the part of the circuit board thus serve for protection against penetrating cooling liquid, rather than, for instance, electrical connection of the embedded semiconductor chip. The electrical connection of the semiconductor chip is undertaken by the first inner conductive layer in the part of the circuit board.

By way of example, the through openings are configured in such a way that a cooling liquid, e.g. a fluid such as, for instance, an ethylene glycol mixture, can flow through them. The coolant flow through the through openings can be part of a coolant circuit in order to cool the semiconductor chip embedded into the circuit board or the plurality of semiconductor chips embedded into the circuit board during operation and thus to protect said semiconductor chip(s) against damage as a result of overheating. In this case, the through openings can be dimensioned and be positioned relative to said one or to said plurality of embedded semiconductor chips in such a way that optimum cooling of the semiconductor body is achieved with the coolant flow. The through openings enable for example balanced pressure ratios of the coolant with respect to the top side and underside of a cooling space. As a result, by way of example, mechanical stressing of the circuit board in the case of pressure changes can be minimized or reduced.

In accordance with one exemplary embodiment of the circuit board, the electrically conductive part can comprise a second inner conductive layer. The second inner conductive layer can be electrically connected to the semiconductor chip. The semiconductor chip can be arranged for example between the first inner conductive layer and the second inner conductive layer. By way of example, vertical power semiconductor components, in which a load current flow takes place via a front and a rear side of the semiconductor chip, can be electrically contacted with the first inner conductive layer and the second inner conductive layer.

In accordance with one exemplary embodiment of the circuit board, the electrically conductive part can completely cover a side surface of the through openings. Thus, for example the semiconductor chip embedded into the circuit board can be protected against cooling liquid penetrating into the interior of the circuit board.

In accordance with one exemplary embodiment of the circuit board, a first anti-corrosion protective structure can be formed on the electrically conductive part at the side surface of the through openings. The first anti-corrosion protective structure can be constructed for example from one layer or a layer stack of suitable materials affording protection against corrosion. Exemplary protective layers are tin, silver or nickel layers, which can be formed for instance with the aid of electrolytic processes.

In accordance with one exemplary embodiment of the circuit board, the first outer conductive layer can be formed at the first surface in the entire part of the circuit board, and the second outer conductive layer can be formed at the second surface in the entire part of the circuit board. The outer conductive layers thus contribute to preventing cooling liquid from penetrating into the interior of the circuit board by way of the first and second surfaces.

In accordance with one exemplary embodiment, the circuit board can comprise a second anti-corrosion protective structure on the first outer conductive layer and on the second outer conductive layer in the part of the circuit board.

In accordance with one exemplary embodiment of the circuit board, the part of the circuit board can comprise a side surface section of the circuit board. The conductive part can be formed in the entire side surface section. If the semiconductor chip embedded into the circuit board is cooled for example by means of a cooling liquid that is also in contact with the side wall section, then it is possible, by means of the conductive part, to prevent cooling liquid from penetrating into the interior of the circuit board and thus to obtain protection of the embedded semiconductor chip.

In accordance with one exemplary embodiment, the circuit board can comprise a third anti-corrosion protective structure on the electrically conductive part in the side surface section of the circuit board.

In accordance with one exemplary embodiment of the circuit board, a diameter of the through openings can be in a range of from 100 µm to 10 mm. Through openings having a diameter in this range enable a suitable cooling effect for semiconductor chips that are embedded into the circuit board alongside the through opening. A diameter of the through openings can be chosen for example in such a way that, for instance, possible particles in the coolant pass through the through openings. Moreover, the diameter of the through openings can be chosen in such a way as to achieve a compromise between pressure decrease and turbulence of the coolant in the case of smaller diameters and robustness vis-à-vis dirty coolants in the case of larger diameters.

One exemplary embodiment relates to a chip cooling housing. The chip cooling housing can comprise a coolant inlet and a coolant outlet and be configured to be secured to a circuit board in such a way that a first part of the circuit board is tightly enclosed by the chip cooling housing and a cooling space is formed between the first part of the circuit board and the chip cooling housing, and a second part of the circuit board projects from the chip cooling housing. The coolant inlet and the coolant outlet can be formed for example as openings in the chip cooling housing. Both the coolant inlet and the coolant outlet can be configured for example in such a way that a coolant supply element, e.g. a coolant hose or a coolant tube, can be secured to the coolant inlet or to the coolant outlet. A surface of the coolant inlet, of the coolant outlet and of an inner wall of the chip cooling housing, which inner walls defines the cooling space, can be lined in each case with an anti-corrosion protective structure. The tight enclosure of the first part of the circuit board is intended to ensure that coolant passes into the cooling space only by way of the coolant inlet and emerges from the cooling space only by way of the coolant outlet. The electrical driving of a semiconductor chip embedded into the circuit board is effected for example by way of the second part of the circuit board, which second part projects from the chip cooling housing.

In accordance with one exemplary embodiment, the chip cooling housing can be formed in an integral fashion and comprise a sealing element. The sealing element can be configured to seal a gap between a circuit board introduced into the cooling space and the chip cooling housing. The sealing element can be a sealing ring, for example. The sealing element can consist of or comprise an elastic material, for example. By way of example, circuit boards having a varying cross section can thus be sealed.

In accordance with one exemplary embodiment, the chip cooling housing can be formed in a bipartite fashion and comprise a securing element and a sealing element. The securing element can be configured to secure a first part of the chip cooling housing and a second part of the chip cooling housing to one another and to the circuit board. The sealing element can additionally be configured to seal a gap between a circuit board introduced into the cooling space and the chip cooling housing. The sealing can be effected for example in a manner similar to that in the case of the above exemplary embodiment. The securing element can be a clamping or screwing element, for example, which fixes the two parts of the chip cooling housing to one another.

In accordance with one exemplary embodiment, the coolant inlet and the coolant outlet can be formed at opposite sides of the chip cooling housing. This enables for example a turbulent flow of the coolant from the coolant inlet to the coolant outlet and also balanced pressure ratios of the coolant with respect to the top side and underside of the cooling space. As a result, by way of example, mechanical stressing of the circuit board in the case of pressure changes can be minimized or reduced.

In accordance with one exemplary embodiment, the coolant inlet and the coolant outlet can be formed at a same side of the chip cooling housing.

One exemplary embodiment relates to an assembly. The assembly can comprise a circuit board in accordance with one exemplary embodiment of this application. The assembly can additionally comprise a chip cooling housing in accordance with one exemplary embodiment of this application, wherein the chip cooling housing is secured to the circuit board.

In accordance with one exemplary embodiment of the assembly, a path of a coolant can pass from the coolant inlet to the coolant outlet through the at least one through opening of the circuit board. The coolant flow through the through opening enables dissipation of heat generated for example during the operation of a power semiconductor component embedded into the circuit board.

In accordance with one exemplary embodiment, the assembly can comprise a barrier structure formed in the cooling space between the circuit board and the housing. The barrier structure can be configured to reduce a flow velocity of a coolant. By way of example, the barrier structure can be fitted on a front and/or a rear side of the circuit board. In accordance with a further example, the barrier structure can be fitted at an inner surface of the chip cooling housing. Since the coolant takes the path of least resistance on its way from the coolant inlet to the coolant outlet, the barrier structure can contribute to setting a desired flow behavior of the coolant. By way of example, the barrier structure makes it possible to produce local regions having higher flow velocity of the coolant and having turbulent flow behavior and thus lower thermal resistance. Other regions, the thermal coupling of which is of secondary importance, can be fashioned for example with lower flow velocity. Measures of this type simplify for example positioning of the coolant inlet and coolant outlet on a same side of the chip cooling housing. If it is assumed that coolant inlet and coolant outlet are situated at the top side of the circuit board, then with the aid of the barrier structure it is possible to obtain a defined flow rate at an underside of the circuit board since the local pressure decrease at the top side of the circuit board can be controlled with the barrier structure. Moreover, besides the function of controlling the coolant flow, the barrier structure can contribute to improving the dissipation of heat, e.g. by enlarging the contact area between the circuit board and the coolant. By way of example, the barrier structure can be fashioned in a meandering shape.

In accordance with one exemplary embodiment, the barrier structure can be secured to the circuit board. The securing can be for example a soldering connection or else a bond connection. In the case of a soldering connection, the securing of the barrier structure can be included for example in the process for the production of the circuit board, e.g. in the context of PCB population.

In accordance with one exemplary embodiment, a path of a coolant can pass from the coolant inlet to the coolant outlet through at least two through openings in the circuit board from the first surface to the second surface and from the second surface to the first surface. By way of example, a path of the coolant from the coolant inlet as far as the coolant outlet can be subdivided into one or more routes by means of a plurality of through openings and suitably positioned barrier structures and can be optimized toward expedient dissipation of heat from the semiconductor chip.

One exemplary embodiment relates to a method for cooling a semiconductor chip. The method can comprise securing a chip cooling housing in accordance with one exemplary embodiment of this application to a circuit board in accordance with one exemplary embodiment of this application, said circuit board comprising the semiconductor chip. The method can additionally comprise introducing a coolant into the cooling space.

In accordance with one exemplary embodiment of the method, the coolant can be circulated in a circuit, wherein the circuit includes the coolant inlet and the coolant outlet.

Structural and/or functional indications given in association with the exemplary embodiments above can be applied to the examples illustrated in the drawings hereinafter.

Figure 1A:
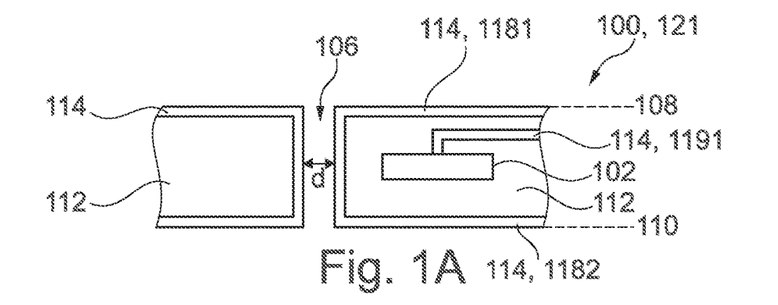
FIG. 1A is a schematic cross-sectional view of a circuit board comprising an embedded semiconductor chip and a through opening for chip cooling.

The schematic cross-sectional view in FIG. 1A illustrates a part 121 of a circuit board 100. At least one semiconductor chip 102 is embedded into the circuit board 100. The circuit board 100 comprises an electrically conductive part 114 and an electrically insulating part 112. The electrically conductive part 114 comprises a first outer conductive layer 1181 on a first surface 108 and a second outer layer 1182 on a second surface 110 of the circuit board 100. The electrically conductive part 114 comprises a first inner conductive layer 1191, which is electrically connected to the semiconductor chip 102. The first inner conductive layer 1191 is electrically insulated from the first outer conductive layer 1181 and from the second outer conductive layer 1182 by the electrically insulating part 112 in the part 121 of the circuit board 100. At least one through opening 106 extends from the first surface 108 of the circuit board 100 to the second surface 110 of the circuit board 100. By way of example, the through opening 106 can be lined with the conductive part 114. Alternatively or additionally, the through opening can be lined with a sealing structure. Likewise, the first and second surfaces 108, 110 and also a side wall of the through opening can be covered with an anti-corrosion protective structure.

In the exemplary embodiment of the circuit board 100 as shown in FIG. 1A, a diameter d of the at least one through opening 106 is for example in a range of from 100 µm to 10 mm.

Figure 1B:
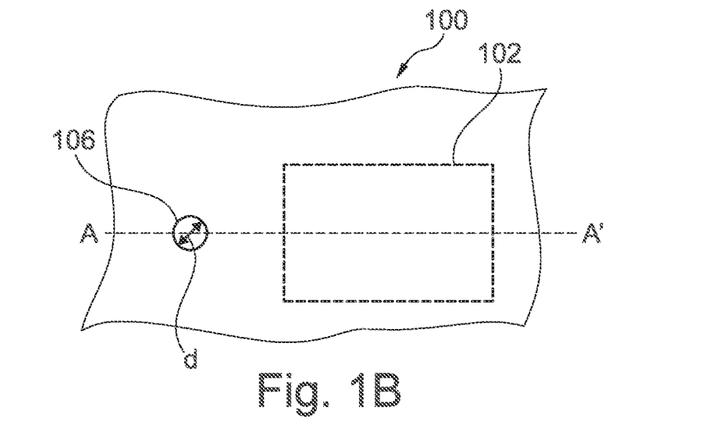
FIG. 1B is a schematic plan view of the circuit board from FIG. 1A.

A schematic plan view of the exemplary embodiment of the circuit board 100 shown in FIG. 1A is illustrated in FIG. 1B, including the cross section—shown in FIG. 1A—along the sectional line AA' taken from FIG. 1B. The semiconductor chip 102 embedded into the circuit board 100 is illustrated schematically by dashed lines in the plan view in FIG. 1B.

Figure 2:
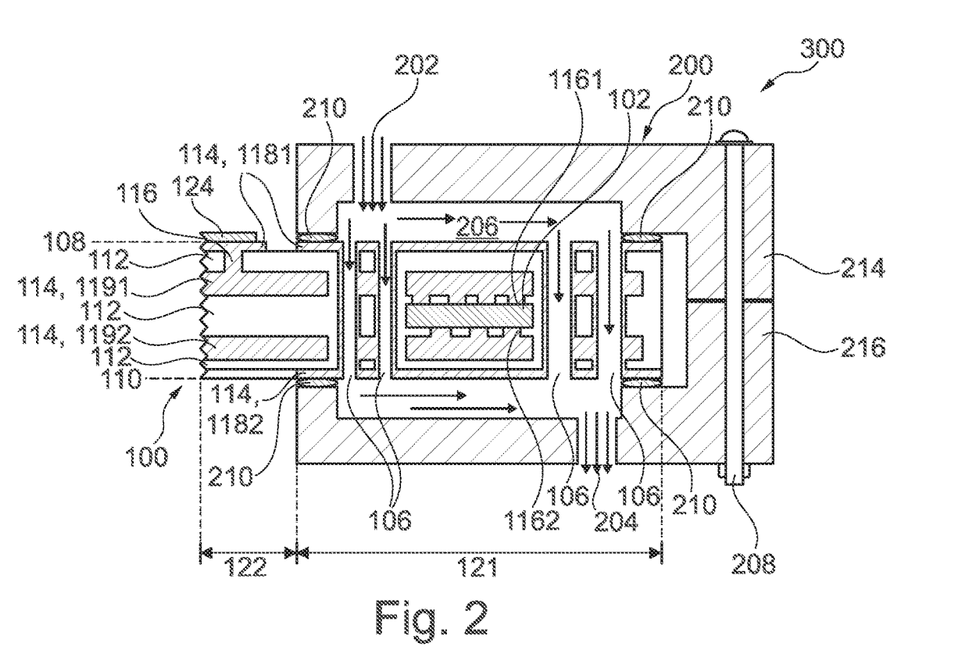
FIG. 2 is a schematic cross-sectional view of an assembly comprising a chip cooling housing, which is fixed to a circuit board and comprises a coolant inlet and a coolant outlet at opposite sides of the chip cooling housing.

Referring to the schematic cross-sectional view in FIG. 2, an assembly 300 comprising the circuit board 100 and a chip cooling housing 200 is described. The chip cooling housing 200 is secured to the circuit board 100. As a result of the securing of the chip cooling housing 200 to the circuit board 100, it is also possible to achieve a sealing of the part 121 of the circuit board 100 within the chip cooling housing 200.

Although the circuit board 100 and the chip cooling housing are illustrated as an assembly in FIG. 2 and also subsequent figures, the chip cooling housing 200 and the circuit board 100 can also be present separately from one another as individual components.

In the case of the circuit board 100 shown in FIG. 2, the semiconductor chip 102 is embedded into the circuit board 100. The semiconductor chip 102 is surrounded by the insulating part 112 of the circuit board 100. The circuit board additionally comprises the conductive part 114, which is arranged in a plurality of layers, wherein the plurality of layers can each be structured, e.g. into conductor tracks and/or terminal regions. The plurality of layers are positioned one above another and separated by the insulating part 112. By way of example, the circuit board illustrated in FIG. 2 comprises the first outer conductive layer 1181 at the first surface 108 and the second outer conductive layer 1182 at the second surface 110. Likewise, the circuit board comprises the first inner conductive layer 1191 and a second inner conductive layer 1192. An electrical connection between conductive layers is produced by vias, cf. e.g. the via 1161 electrically connecting the first outer layer 1181 to the first inner conductive layer 1191 in a second part 122 of the circuit board 100. Vias extend through the insulating part 112.

The semiconductor chip 102 is embedded into the insulating material 112 between the first inner conductive layer 1191 and the second inner conductive layer 1192 and is electrically contacted at opposite sides of the semiconductor chip 102. By way of example, a first load terminal of the semiconductor chip 102 is electrically connected to the first inner conductive layer 1191 by way of first vias 1161 and a second load terminal of the semiconductor chip 102 is electrically connected to the second inner conductive layer 1192 by way of second vias 1162. In addition or as an alternative to vias, soldered, sintered or else bonded electrical connections between the conductive layers are also possible. The semiconductor chip can be for example a vertical power semiconductor component, e.g. an IGFET, an IGBT, a thyristor, or a diode.

The chip cooling housing 200 comprises a coolant inlet 202 and a coolant outlet 204. The chip cooling housing 200 is configured to be secured to the circuit board 100 in such a way that the first part 121 of the circuit board 100 is tightly enclosed by the chip cooling housing 200 and a cooling space 206 is formed between the first part 121 of the circuit board 100 and the chip cooling housing 200, and the second part 122 of the circuit board 100 projects from the chip cooling housing 200. The flow course of the coolant between the coolant inlet 202 and the coolant outlet 204 is identified schematically by arrows.

In the exemplary embodiment in FIG. 2, the chip cooling housing 200 is formed in a bipartite fashion. A first part 214 of the chip cooling housing 200 and a second part 216 of the chip cooling housing 200 are connected to one another by a securing element, e.g. a screw 208. The securing element likewise serves for fixing the circuit board 100 to the chip cooling housing 200. A sealing element 210 of the chip cooling housing 200 is configured to seal a gap between the circuit board 100 introduced into the cooling space 206 and the chip cooling housing 200. The circuit board 100 can additionally be fixed to the chip cooling housing 200 at one or at a plurality of further points within the cooling space 206 in order to improve the stability of the fixing. In other embodiments, the chip cooling housing 200 can also be formed in an integral fashion. By way of example, the chip cooling housing can be provided with a folding mechanism. Moreover, the chip cooling housing 200 can consist of more than two parts, which can be fixed to the circuit board by means of securing devices. The sealing element 210 can be formed both as part of the chip cooling housing 200 and as part of the circuit board 100, or else be present separately therefrom.

The semiconductor chip 102 can be electrically driven for example by way of contact regions, e.g. the contact region 124, on the first and/or second outer conductive layers 1181, 1182 in the second part 122 of the circuit board 100. An energy supply of the semiconductor chip 102, input and output signals, control signals, or else a load current flow can thus be passed via the second part 122 of the circuit board to the semiconductor chip 102.

Figure 3:
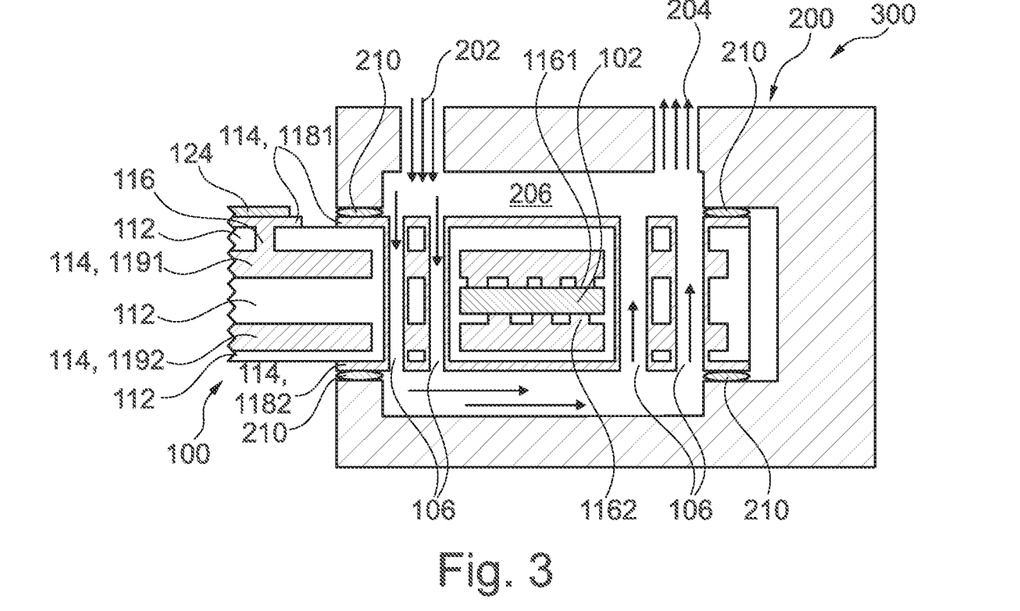
FIG. 3 is a schematic cross-sectional view of an assembly comprising a chip cooling housing, which is fixed to a circuit board and comprises a coolant inlet and a coolant outlet at the same side of the chip cooling housing.

In the case of the exemplary embodiment of the chip cooling housing 200 in FIG. 2, the coolant inlet 202 and the coolant outlet 204 are arranged at opposite sides of the chip cooling housing 200. In the schematic cross-sectional view in FIG. 3, the coolant inlet 202 and the coolant outlet 204 of the chip cooling housing 200 are formed at the same side of the chip cooling housing 200.

Figure 4:
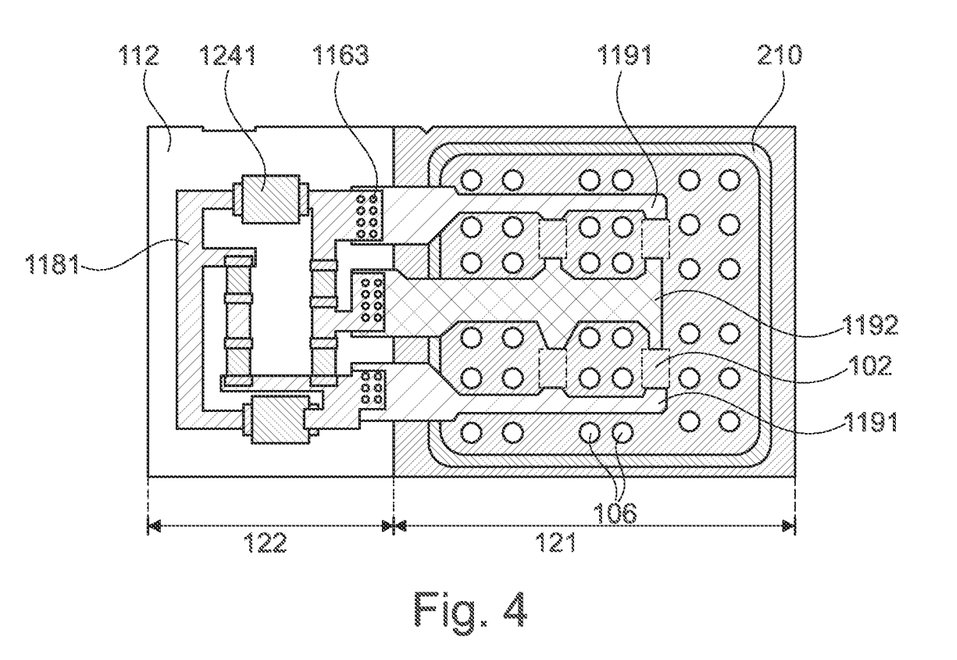
FIG. 4 shows a schematic plan view of a circuit board in accordance with one exemplary embodiment.

FIG. 4 illustrates a schematic plan view of one exemplary embodiment of the circuit board 100. A plurality of semiconductor chips 102 are embedded in the circuit board 100. The electrical driving of the semiconductor chips 102 is effected by way of the first and second inner conductive layers 1191, 1192 of the circuit board 100. In the first part 121 of the circuit board, the first and second inner conductive layers 1191, 1192 of the circuit board 100 are electrically connected to the first outer conductive layer 1181 by way of vias 1163 and can be electrically connected to components 1241 illustrated by way of example on the circuit board 100.

Figure 5:
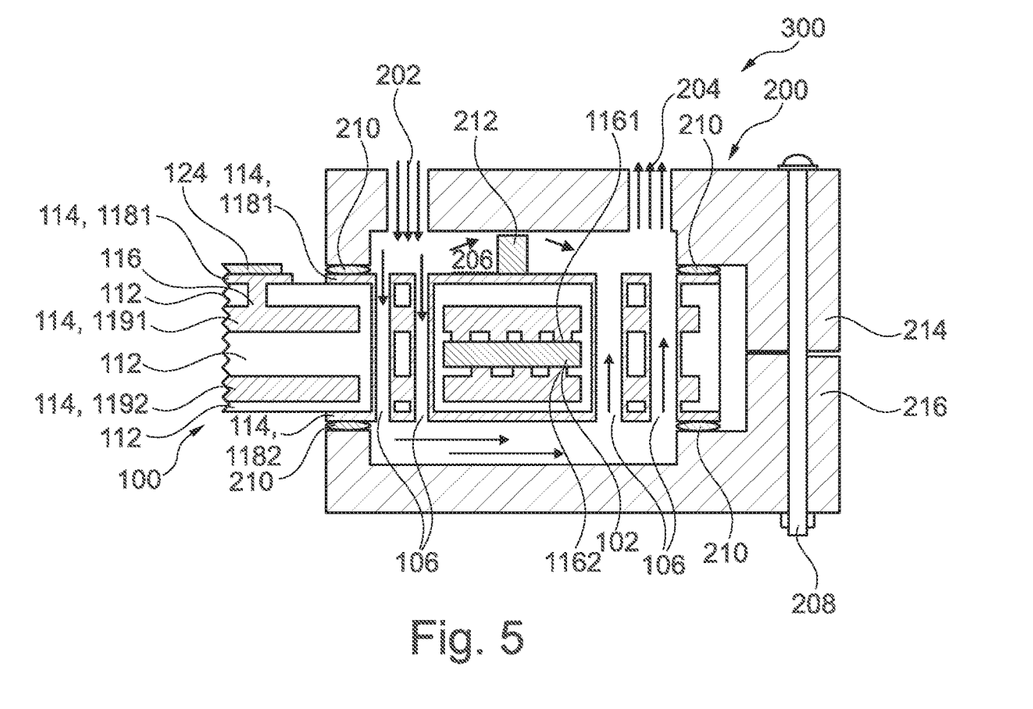
FIGS. 5 and 6 show respective schematic cross-sectional views of assemblies comprising a chip cooling housing and a circuit board and also a barrier structure for influencing the coolant flow between the coolant inlet and the coolant outlet.
Figure 6:
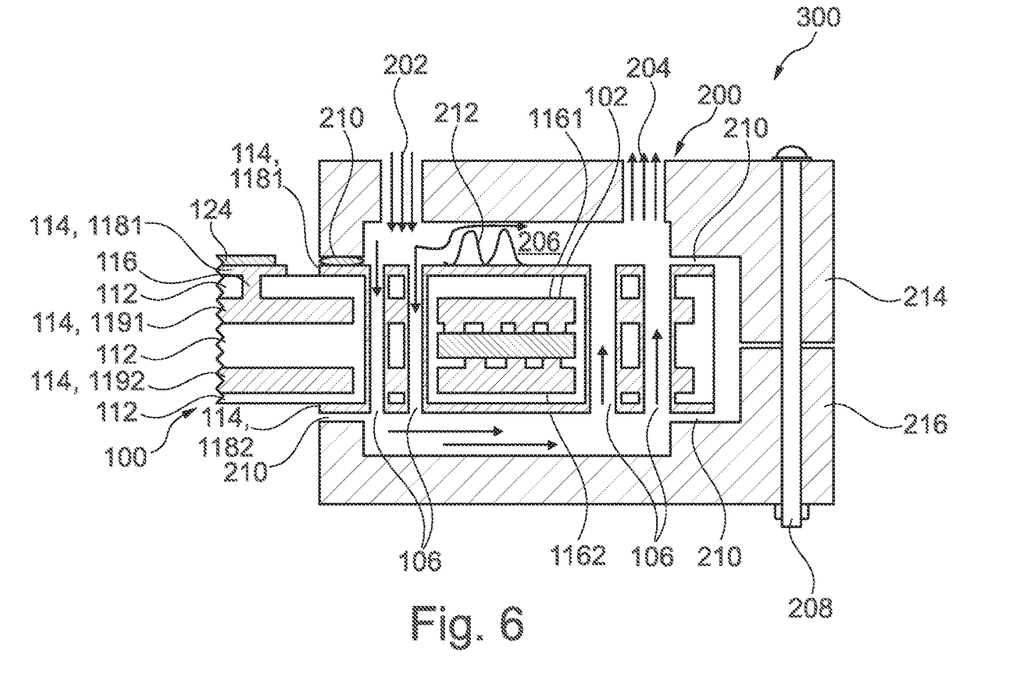

The schematic cross-sectional views in FIG. 5 and FIG. 6 illustrate exemplary embodiments of circuit boards 100 and chip cooling housings 200 in which a barrier structure 212 is formed in the cooling space 206 between the circuit board 100 and the chip cooling housing 200 in order to reduce a flow velocity of a coolant. The barrier structure 212 can have a suitable shape and lateral extent in order to influence the coolant flow between the coolant inlet 202 and the coolant outlet 204 in a desired manner. By way of example, the barrier structure can be formed in a rod-shaped fashion with a rectangular cross section, as is shown in FIG. 5, or else in an undulatory fashion, as is shown in FIG. 6.

Other exemplary embodiments of circuit boards differ for example from the circuit boards shown by way of example in FIGS. 1 to 6 inter alia in terms of one or more of the properties: number of conductive layers, structuring of the conductive layers, number of vias, positioning of the vias, positioning of the embedded semiconductor chip, number of embedded semiconductor chips, number of through openings, positioning of the through openings, dimensions of the circuit board, material composition of the circuit board.

Although specific embodiments have been illustrated and described here, it is obvious to the person skilled in the art that a large number of alternative and/or equivalent configurations can be used for the specific embodiments shown and described, without departing from the scope of the present invention. This application is therefore intended to cover any adaptations or variations of the specific embodiments discussed here. Therefore, the intention is for this invention to be limited only by the patent claims and the equivalents thereof.

What is claimed is:

1. A printed circuit board, comprising:
   an electrically insulating part and an electrically conductive part;
   at least one semiconductor chip embedded into the electrically insulating part in a part of the printed circuit board; and
   a cooling area above and below the at least one semiconductor chip,
   wherein the electrically conductive part comprises a first outer conductive layer on a first surface of the printed circuit board, a second outer conductive layer on a second surface of the printed circuit board, and a first inner conductive layer which is electrically connected to the semiconductor chip,
   wherein the first inner conductive layer is electrically insulated from the first outer conductive layer and from the second outer conductive layer by the electrically insulating part in the cooling area, or is electrically connected to the first outer conductive layer outside the cooling area.

2. The printed circuit board of claim 1, wherein the electrically conductive part comprises a second inner conductive layer which is electrically connected to the semiconductor chip.

3. The printed circuit board of claim 2, wherein the second inner conductive layer is electrically insulated from the first outer conductive layer and from the second outer conductive layer by the electrically insulating part in the cooling area or is electrically connected to the first outer conductive layer outside the cooling area.

4. The printed circuit board of claim 2, wherein the at least one semiconductor chip is embedded into the electrically insulating part between the first inner conductive layer and the second inner conductive layer and is electrically contacted at opposite sides of the at least one semiconductor chip.

5. The printed circuit board of claim 4, wherein a first load terminal of the at least one semiconductor chip is electrically connected to the first inner conductive layer by way of first vias and a second load terminal of the at least one semiconductor chip is electrically connected to the second inner conductive layer by way of second vias.

6. The printed circuit board of claim 2, wherein the first and second inner conductive layers are electrically connected to the first outer conductive layer by way of vias.

7. The printed circuit board of claim 2, wherein the first and second inner conductive layers provide electrical driving of the at least one semiconductor chip.

8. The printed circuit board of claim 2, wherein the first and second inner conductive layers are electrically connected to components on the printed circuit board.

9. The printed circuit board of claim 1, wherein the first outer conductive layer is formed at the first surface in an entire part of the printed circuit board, and wherein the second outer conductive layer is formed at the second surface in the entire part of the printed circuit board.

10. The printed circuit board of claim 9, further comprising an anti-corrosion protective structure on the first outer conductive layer and on the second outer conductive layer in the part of the printed circuit board.

11. An assembly, comprising:
a printed circuit board; and
a chip cooling housing secured to the printed circuit board,
wherein the printed circuit board comprises an electrically insulating part and an electrically conductive part, at least one semiconductor chip embedded into the electrically insulating part in a part of the printed circuit board, and a cooling area above and below the at least one semiconductor chip,
wherein the electrically conductive part comprises a first outer conductive layer on a first surface of the printed circuit board, a second outer conductive layer on a second surface of the printed circuit board, and a first inner conductive layer which is electrically connected to the semiconductor chip,
wherein the first inner conductive layer is electrically insulated from the first outer conductive layer and from the second outer conductive layer by the electrically insulating part in the cooling area, or is electrically connected to the first outer conductive layer outside the cooling area.

12. The assembly of claim 11, wherein the electrically conductive part comprises a second inner conductive layer which is electrically connected to the semiconductor chip.

13. The assembly of claim 12, wherein the second inner conductive layer is electrically insulated from the first outer conductive layer and from the second outer conductive layer by the electrically insulating part in the cooling area or is electrically connected to the first outer conductive layer outside the cooling area.

14. The assembly of claim 12, wherein the at least one semiconductor chip is embedded into the electrically insulating part between the first inner conductive layer and the second inner conductive layer and is electrically contacted at opposite sides of the at least one semiconductor chip.

15. The assembly of claim 14, wherein a first load terminal of the at least one semiconductor chip is electrically connected to the first inner conductive layer by way of first vias and a second load terminal of the at least one semiconductor chip is electrically connected to the second inner conductive layer by way of second vias.

16. The assembly of claim 12, wherein the first and second inner conductive layers are electrically connected to the first outer conductive layer by way of vias.

17. The assembly of claim 12, wherein the first and second inner conductive layers provide electrical driving of the at least one semiconductor chip.

18. The assembly of claim 12, wherein the first and second inner conductive layers are electrically connected to components on the printed circuit board.

19. The assembly of claim 11, wherein the first outer conductive layer is formed at the first surface in an entire part of the printed circuit board, and wherein the second outer conductive layer is formed at the second surface in the entire part of the printed circuit board.

20. The assembly of claim 19, further comprising an anti-corrosion protective structure on the first outer conductive layer and on the second outer conductive layer in the part of the printed circuit board.

* * * * *